(12) United States Patent
Jain

(10) Patent No.: US 6,711,081 B1
(45) Date of Patent: Mar. 23, 2004

(54) REFRESHING OF MULTI-PORT MEMORY IN INTEGRATED CIRCUITS

(75) Inventor: Raj Kumar Jain, Singapore (SG)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/065,128

(22) Filed: Sep. 19, 2002

(51) Int. Cl.[7] .................................................. G11C 7/00

(52) U.S. Cl. ......................... 365/222; 365/154; 365/156

(58) Field of Search ................................. 365/222, 154, 365/156, 149

(56) References Cited

U.S. PATENT DOCUMENTS

| | | | | | |
|---|---|---|---|---|---|
| 4,203,159 | A | * | 5/1980 | Wanlass | 365/222 |
| 5,724,296 | A | * | 3/1998 | Jang | 365/222 |
| 6,233,193 | B1 | * | 5/2001 | Holland et al. | 365/222 |
| 6,487,107 | B1 | * | 11/2002 | Jain | 365/154 |

* cited by examiner

*Primary Examiner*—Huan Hoang
(74) *Attorney, Agent, or Firm*—Horizon IP Pte Ltd

(57) ABSTRACT

A dual port memory module comprising a contention circuit for refresh in order to detect a conflict between an externally requested access and a refresh operation is described. The refresh operation is allocated to the port that is not externally accessed. When accesses through both ports are requested, a wait cycle for one of the access requests is inserted until the refresh is terminated.

20 Claims, 5 Drawing Sheets

REFRESHING OF MULTI-PORT MEMORY IN INTEGRATED CIRCUITS

BACKGROUND OF INVENTION

Integrated circuits, such as digital signal processors (DSPs), use on-chip memory (memory module) to store information to be processed. The on-chip memory comprises, for example, an array of static random access memory cells or alternatively dynamic random access memory cells. The memory cells are connected to wordlines travelling in one direction and to bitlines travelling in another direction. Dynamic memory cells comprise a storage capacitor and at least one access transistor. The charge stored in the storage capacitor is indicative of the information stored (e.g., logic 0 or logic 1). Due to leakage effects the charge in the storage capacitor dissipates over time. The stored charge, therefore, has to be refreshed periodically to ensure that the memory cell maintains the correct information during the operation of the IC.

In some applications, a dual port memory module, is used. A dual port memory module includes first and second ports through which the memory cells can be accessed. Each port includes signal lines for receiving address, data and control signals. Each port, for example, includes an address decoder which selects a particular wordline or row of memory cells within the memory cell array. The memory cells are connected to both access ports by two separate wordlines and two separate bitlines.

The memory cells of the array must be refreshed after a specified time (e.g., retention time). However, the refresh cycle may coincide with the occurrence of an access request to the memory cell array through either one of the access ports. Conventionally, accesses to the memory module are halted until the refresh cycle is completed, which adversely impacts performance of the system.

From the foregoing discussion, there is a desire to provide a multi-port memory module in which the adverse impact on system performance by the refresh cycle is reduced.

SUMMARY OF INVENTION

The invention relates generally to ICs with a memory module. In particular, the invention relates to efficiently refreshing a multi-port memory module. In one embodiment, the memory modules include first and second ports. A control block manages the memory accesses and refresh requests. In one embodiment, the control block includes a contention detection circuit that monitors the memory access requests through the access ports as well as the refresh operations. A refresh counter provides the sequence of addresses of rows of memory cells that are to be refreshed. The addresses of memory accesses rows are provided through the access ports. The address decoder within each port activates the row either for a refresh or for a memory access. The contention circuit ensures that a refresh operation is allocated to a port which is not used for a memory access at the same time.

DETAILED DESCRIPTION

Figure 1:
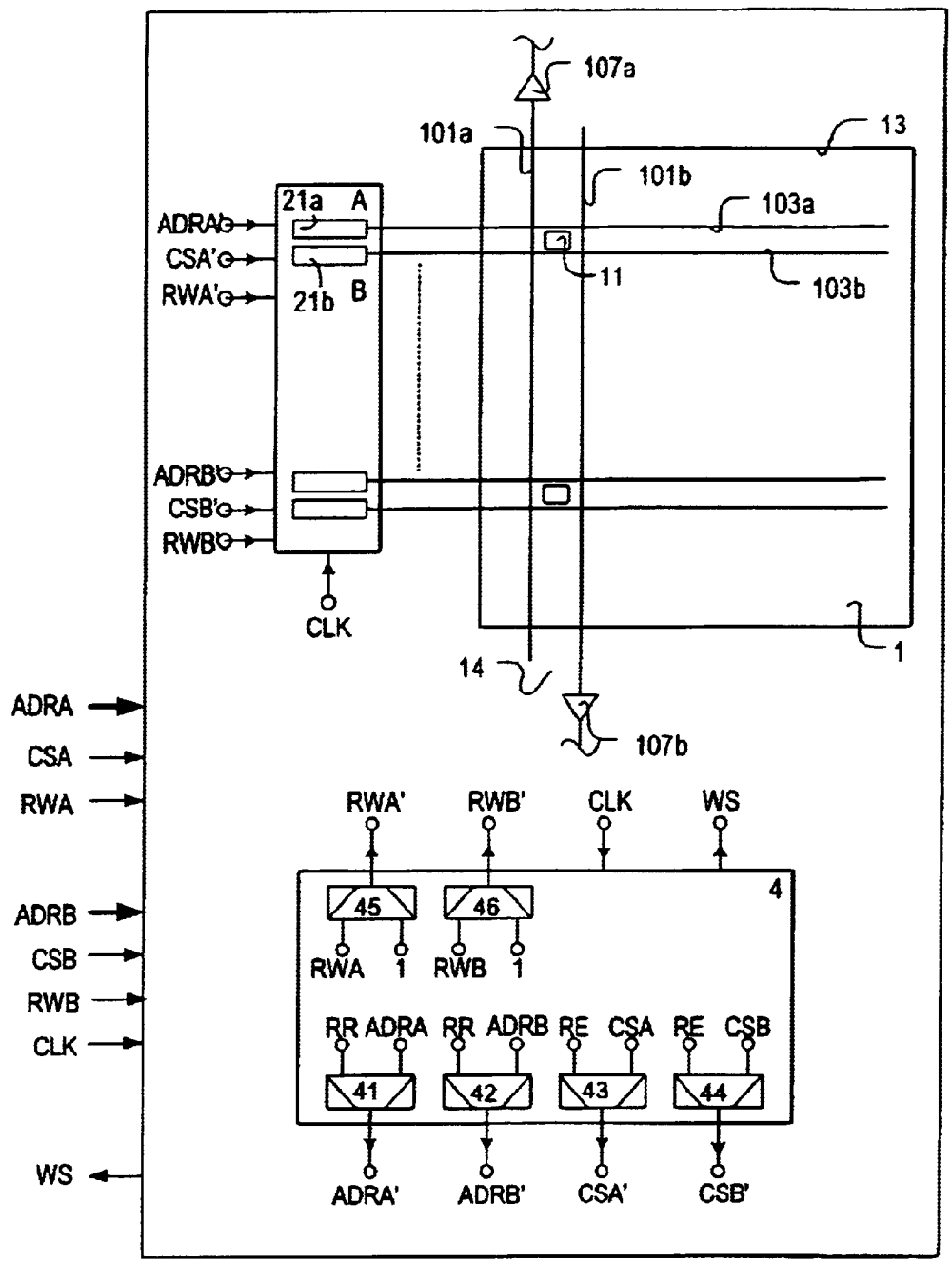
FIG. 1 shows a block diagram of a dual port memory.

FIG. 1 shows a block diagram of a dual-port memory module in accordance with one embodiment of the invention. The memory module, for example, could be embedded into an IC, such as a DSP. Other types of ICs, such as memory ICs, are also useful. As shown in FIG. 1, the memory module includes a memory array 1 which can be accessed through first and second ports 2 and 3 (port A and port B). Providing a memory module with additional memory arrays or additional ports is also useful. The memory module, for example, can be accessed by multiple signal processors or micro-controllers.

The memory array 1 comprises a plurality of memory cells 11 arranged in rows 13 and columns 14. A row of memory cells includes first and second wordlines 103a–b. The first wordline is controlled by a first row decoder 21a and the second wordline id controlled by a second row decoder 21b. A column of memory cells includes first and second bitlines 101a–b. First sense amplifiers 107a are coupled to the first bitlines and second sense amplifiers 107b are coupled to the second bitlines.

Figure 2:
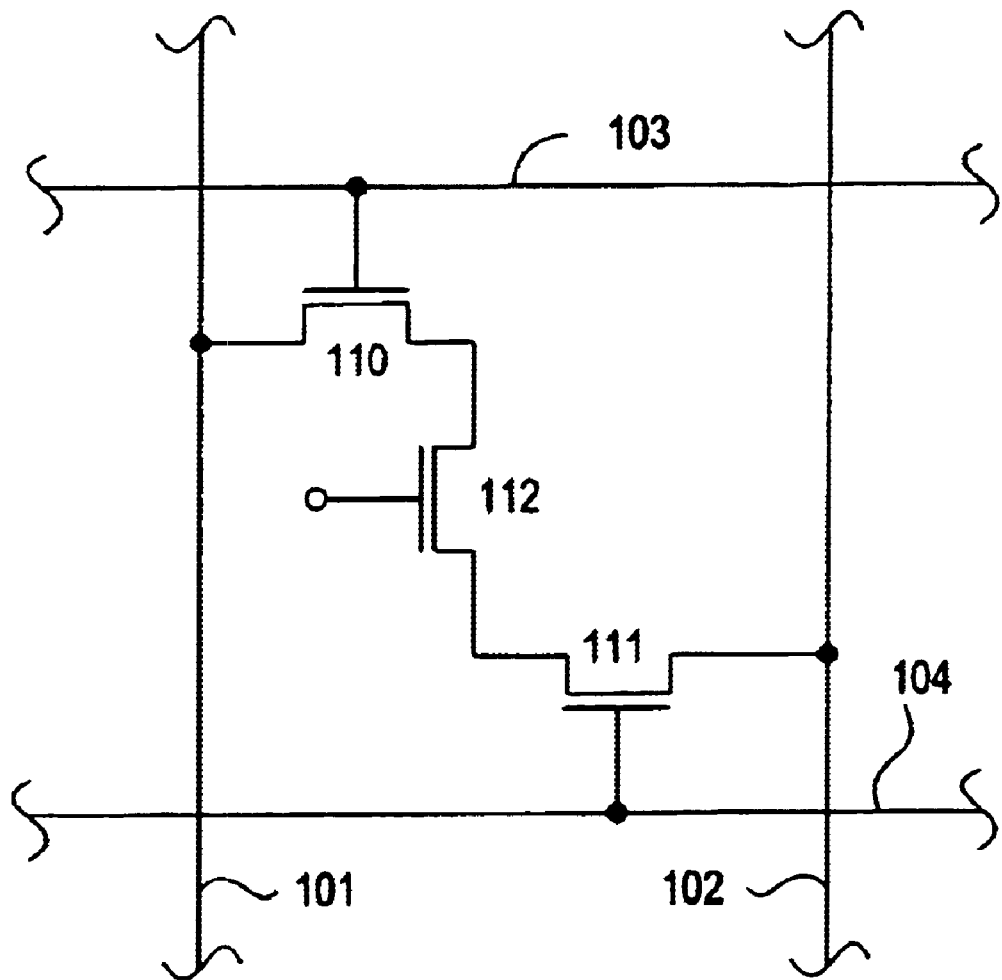
FIG. 2 shows a particular memory cell of the memory cell array shown in FIG. 1.

FIG. 2 shows a dual-port memory cell in accordance with one embodiment of the invention. The memory cell comprises two access transistors 110, 111 and a storage transistor 112, which drain and source terminals are connected to the transistors 110, 111. The gate electrode of the storage transistor 112 is biased by the upper supply potential $V_{DD}$, when n-channel-MOS-transistors are used. Alternatively, p-channel-MOS-transistors can be used. In this cases, the gate electrode of the storage transistor is biased by the lower supply potential $V_{SS}$. The drain/source path of transistor 110 is connected to a first bitline 101, the drain/source path of transistor 111 is connected to a second bitline 102. The gate electrodes of transistors 110, 111 are connected to separate wordlines 103 and 104, respectively. Bitline 101 and wordline 103 are connected to port A; wordline 104 and bitline 102 are connected to port B. In alternative embodiment, other types of dual port or multi-port memory cells can be used in the memory module. To access the memory cell through either of the ports, the respective wordline is activated and is brought to a high potential ($V_{DD}$) to make the respective access transistor conducting. Activating the wordlines with a boosted voltage which is greater than $V_{DD}$ is also useful.

Referring back to FIG. 1, a control block 4 is provided to control accesses to the memory array. The control block, for example, is a state machine. Other types of circuit or logic block can also be used. The control block receives control signals, such as read/write and address information and in response generates signals for accessing the memory module. To access the memory module through port A, the control block generates active CSA signal and the address of the memory cell to be accessed (ADRA). An RWA signal is also generated. Depending on whether the access is a read or write access, the RWA signal will either be a logic 1 or logic 0. For example, RWA is equal to a logic 1 for a read access and a logic 0 for a write access. Similarly, if the access is through port B, CSB and address of the memory cell (ADRB) are generated along with RWB to indicate whether the access is a read or write. Data is provided during a write access or retrieved during a read access (e.g., DATAA, DATAB).

In accordance with one embodiment of the invention, the control block includes a refresh control block for controlling the refresh operations. Providing a refresh control block which is separate from the control block is also useful. In one embodiment, the refresh control enables memory accesses to the memory module during a refresh operation.

The refresh control block generates refresh enable (RE), refresh row address (RR), and wait (WSB) signals and outputs them to the respective control inputs of the ports A and B. These signals will later be to be explained. The control circuit 4 comprises multiplexers 41–46 that output alternative signals for the normal access to a port and for a refresh access.

Figure 3:
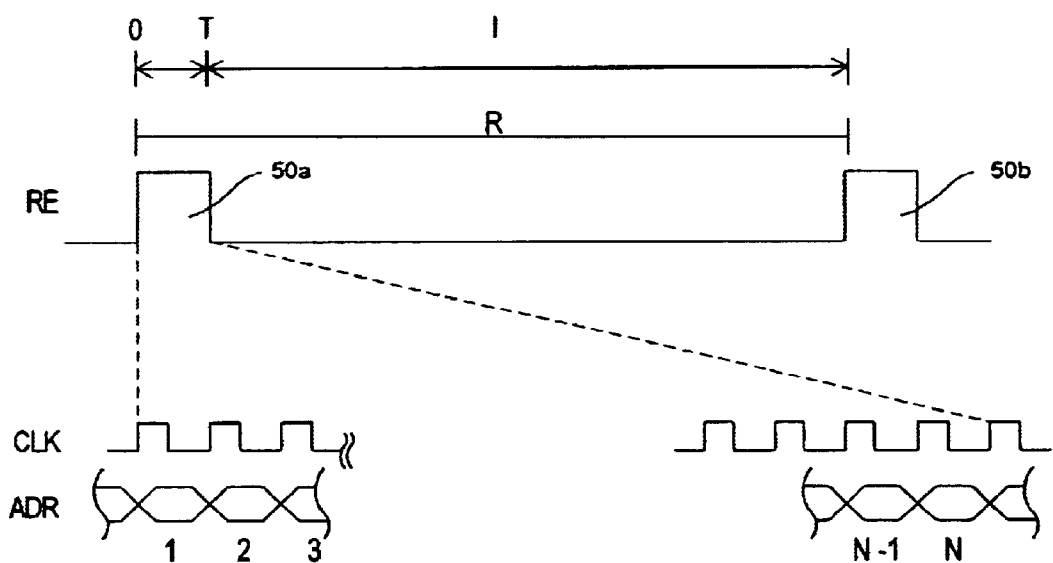
FIG. 3 shows a diagram of a refresh cycle.

FIG. 3 shows the refresh timing in accordance with one embodiment of the invention. The refresh is performed within a refresh cycle 50 between the time instances 0 and T. Two refresh cycles 50*a–b* are separated by the refresh idle time I. The retention time R is the combination of refresh cycle time T and idle time I. The retention time R is selected such that the charge stored within the storage capacitors is sufficiently high enough to be correctly detected for a subsequent refresh. During a refresh cycle 50 all n rows of the memory cell array have to be refreshed. In one embodiment, the n rows are refreshed sequentially through either the first or second port. The memory cells are refreshed by, for example, performing a read access to the memory cells of a row. The refresh operation is repeated n times for all n rows of the cell array. After the expiration of the retention time R, the same procedure is repeated.

Figure 4:
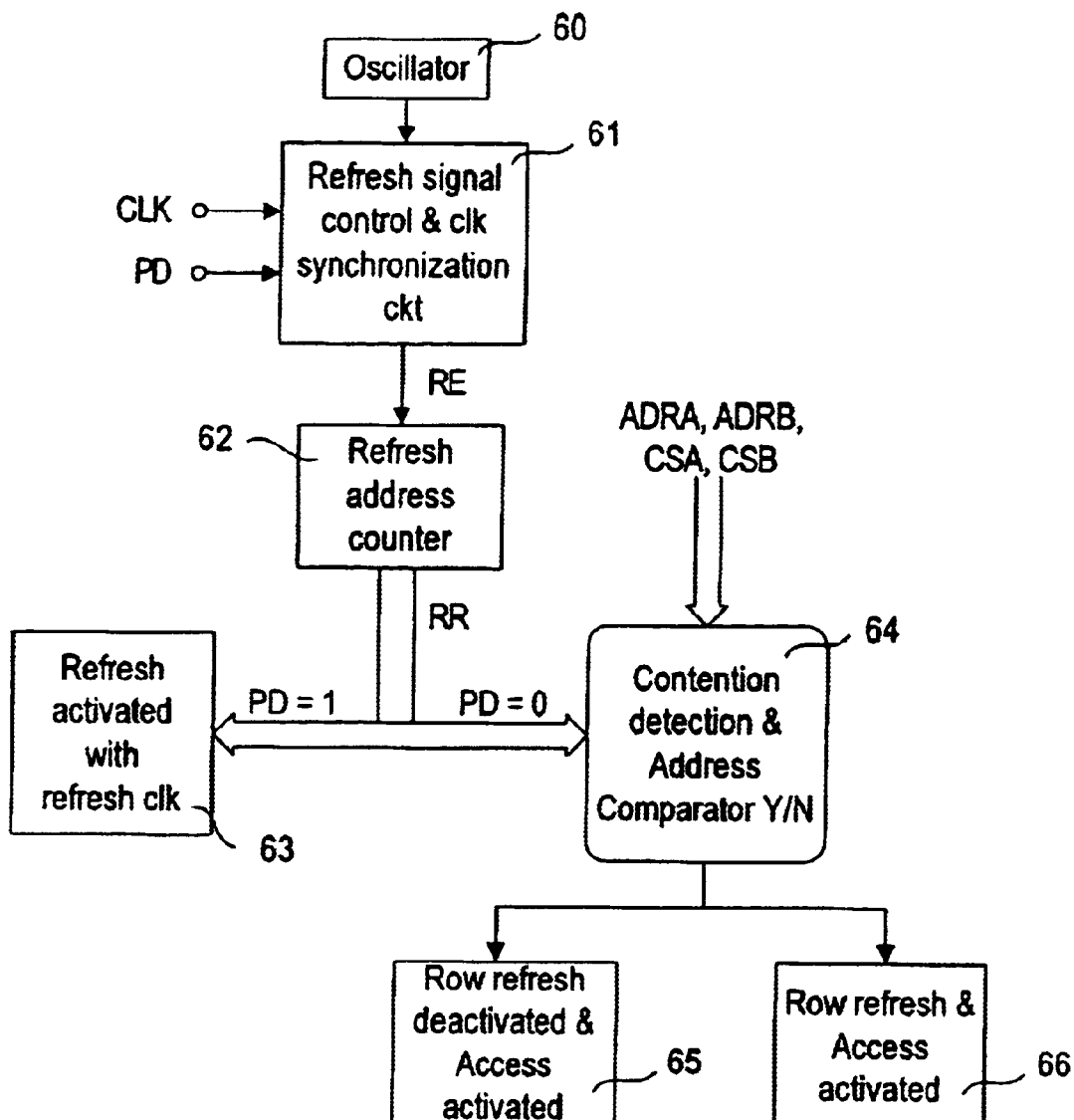
FIG. 4 shows a functional diagram of a refresh control circuit.

FIG. 4 shows an operational diagram of a control circuit 4 in accordance with one embodiment of the invention. The control circuit, for example, is a state machine. The control circuit comprises a control block 61. The control block receives a system clock signal CLK which controls the function of the memory module. The IC can have two modes of operation, power down or normal. The operating modes of the IC can be controlled by the PD signal. In one embodiment, a second clock signal is provided to the control block. The second clock signal is generated by, for example, an oscillator 60.

In one embodiment, the control generates a refresh enable signal (RE). The refresh control signal can be synchronized with either of the clock signals. The RE signal controls a refresh address counter 62 that provides the sequence of the row addresses of the memory cell array. The refresh address counter outputs the refresh address RR. In one embodiment, if the IC is in power down mode (e.g., PD=1), the refresh is activated using the refresh clock from oscillator 60 by function block 63. In the power down mode, the IC is not susceptible to access requests through ports A and B.

When the IC is in normal operation (e.g., PD=0), the refresh address RR is forwarded to function block 64 which performs contention detection. Contention detection is performed, in one embodiment, by comparing the address of the access and refresh address. Function block 64 is provided with any addresses ADRA, ADRB subject to an access through port A or B and the port select signals CSA, CSB. During a refresh operation, four different contention scenarios or states can occur, as shown in Table 1.

TABLE 1

| State | Port A | Port B | Refresh allocation |
|---|---|---|---|
| 1 | — | — | Port A/Port B |
| 2 | ✓ | — | Port B |

TABLE 1-continued

| State | Port A | Port B | Refresh allocation |
|---|---|---|---|
| 3 | — | ✓ | Port A |
| 4 | ✓ | ✓ | Port B |

State 1 represents the case where no memory access is requested during a refresh request. In the absence of a contention between a refresh and a memory access, the row addressed by the refresh counter can be refreshed through either of the ports. In a preferred embodiment, one of the ports can be dedicated for refreshing (e.g., port A) when no contention occurs.

State 2 represents the case where a memory access is requested through port A while a refresh is requested. The addresses of the refresh and access are compared. If the addresses of the access and refresh are to different rows, the access is conducted through port A while the refresh operation is allocated to port B. The row corresponding to the refresh address is refreshed through port B. Alternatively, a memory access through port B is requested simultaneously with a refresh request, as represented by state 3. In such a case, the memory access is performed through port B while the refresh is conducted through port A if the addresses of the access and refresh are to different rows.

In one embodiment, for states 2 or 3, where an access is a read access to the same row which is to be refreshed, the refresh is suppressed or omitted. All the memory cells of the row are read. However, only data from the selected cell or cells of the row is output. The reading of the cells effectively refreshes the row. For a write operation, the non selected cells of the row are read without outputting their data. Alternatively, the refresh can be performed from on port while the access is performed from the other port.

In the case where memory accesses via both ports are requested along with a refresh request (state 4), one of the accesses is performed through one of the ports while a refresh is performed through the other port if neither of the accesses is to the row which is to be refreshed. The second access is delayed with a wait signal until the refresh is completed. The wait signal also informs that the access to other port is delayed. For example, the access to port A is performed, the access to port B is delayed, and the refresh is performed through port B. Assigning priority to port B for memory accesses in such a case is also useful. The priority of access to the ports can be rotated through the use of a flag.

In the case where one of the accesses is to a row which is to be refreshed, the refresh operation can be disabled. Both rows can be accessed. In the case where a write access is performed to a memory cell on the row which is to be refreshed, the selected memory cell is written to while the other memory cells of the row are read.

When port A or port B is used for the refresh, the row decoder in the respective port A or B is provided with the address of the row from the refresh address counter.

The function block 64 performing the function of contention detection and address comparison performs the following decisions:

1. When RE=0, then there is no conflict between port access and refresh. The row address ADRA is provided to the first decoder through its input ADRA', the row address ADRB is provided to the second decoder through its input ADRB'. Decoders activate one of the wordlines to read or write data from or into one or several of the memory cells of a row.

2. When RE=1 and none of the ports A or B is selected for an external access, the refresh address RR is provided to one of ports A and B through one of their inputs ADRA' and ADRB'.

3. When RE=1 and only port A is selected for an external access, the row address ADRA for the access through port A is provided to first row decoder. The refresh address RR is provided to second row decoder to perform the refresh.

4. When RE=1 and only port B is selected for an external access, the row address ADRB for the access through port B is provided to the second row decoder. The refresh address RR is provided to first row decoder for refresh.

5. When RE=1 and both ports A and B are selected for an external access, the address ADRA for access of port A is provided to first row decoder to perform the requested access. The refresh address RR from refresh address counter 62 is provided to second row decoder to perform the refresh. In addition, a wait cycle signal WSB is issued by refresh control block 4 to delay the read/write address with respect to row address ADRB by one cycle so that the refresh cycle can be performed through the second row address decoder of port B.

In all of the cases 3 through 5 it is assumed that the refresh address RR from refresh address counter 62 is different from the read/write addresses ADRA, ADRB. If this is not the case and the refresh address RR is equal to one of the row addresses ADRA, ADRB which are Intended for an access, the refresh of the particular row is suppressed. Also in case 5 the issuance of the wait cycle signal WSB is omitted. Instead, the access is performed. The function block 64 contains a comparator that compares the row addresses of memory cells to be accessed for read/write and the row address for a refresh.

Figure 5:
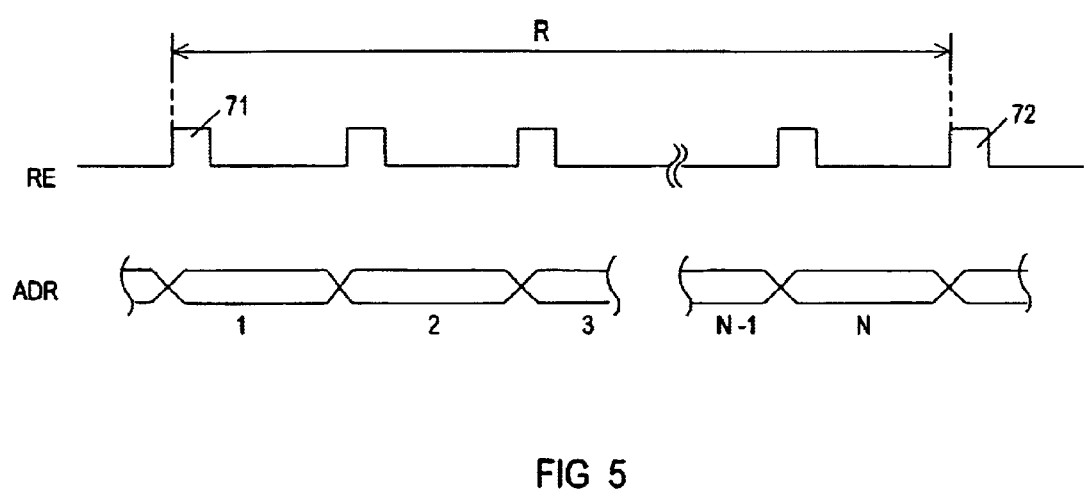
FIG. 5 shows an alternative timing diagram of a refresh cycle.

In FIG. 5 an alternative time scheme is shown to perform the periodic refresh of the memory cell array. The time period between the pulses 71 and 72 of the refresh enable signal RE is the same as in FIG. 3. The refresh enable signal, however, has a sequence of shorter pulses as compared to FIG. 3 and is repeated several times. The refresh enable signal is distributed over the period R over N pulses. Whereas all N rows are refreshed in time period 0, T according to FIG. 3, only one of the N rows is refreshed in one of the pulses (e.g., 71 In FIG. 5).

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

I claim:

1. A memory device comprising:
    a memory cell array having a plurality of memory cells, first and second bitlines, and first and second wordlines, each of said memory cells being coupled to one of said first bitlines, one of said second bitlines, one of said first wordlines and one of said second wordlines;
    a first wordline decoder being coupled to said multitude of first wordlines to activate one of said wordlines;
    a second wordline decoder being coupled to said multitude of wordlines to activate one of said second wordlines;
    wherein each of said first and second wordline decoders is designed to perform an access to one of said memory cells by enabling one of the multitude of said wordlines;
    a refresh control circuit arrangement including a contention circuit that allocates a refresh to one of said wordline decoders, whereby said one of said wordline decoders is currently not used for an external access to one of the memory cells of said memory cell array; and
    wherein said contention circuit is designed to select said one of said first and second wordline decoders to perform a refresh operation to said memory cells conected to said multitude of worklines coupled to said one of said first and second wordline decoders and is designed to select another one of said first and second wordline decoders to perform an external access and to issue a wait cycle for said one of said first and second decoders when said one wordline decoder receives an external request for an access.

2. A memory device comprising:
    a memory cell array having a plurality of memory cells, first and second bitlines, and first and second wordlines, each of said memory cells being coupled to one of said first bitlines, one of said second bitlines, one of said first wordlines and one of said second wordlines;
    a first wordline decoder being coupled to said multitude of first wordlines to activate one of said wordlines;
    a second wordline decoder being coupled to said multitude of first wordlines to activate one of said second wordlines;
    a refresh control circuit arrangement including a contention circuit that allocates a refresh to one of said wordline decoders, whereby said one of said wordline decoders is currently not used for an external access to one of the memory cells of said memory cell array; and
    wherein said refresh control circuit arrangement comprises a refresh address counter that counts the addresses of the wordlines to be refreshed and comprises a comparator to compare said address of said wordline to be refresh with an address of a wordline to be accessed upon an external request, wherein in response to an address match a refresh cycle is suppressed.

3. A memory device comprising:
    a memory cell array having a plurality of memory cells, first and second bitlines, and first and second wordlines, each of said memory cells being coupled to one of said first bitlines, one of said second bitlines, one of said first wordlines and one of said second wordlines;
    a first wordline decoder being coupled to said multitude of first wordlines to activate one of said wordlines;
    a second wordline decoder being coupled to said multitude of wordlines to activate one of said second wordlines;
    a first access port and a second access port, said first access port comprising said first wordline decoder and said second access port comprising said second wordline decoder;
    a first terminal to provide a first select signal to enable an access through said first port;
    a second terminal to provide a second port select signal to enable an access through said second port;
    a refresh control circuit arrangement including a contention circuit that allocates a refresh to one of said wordline decoders, whereby said one of said wordline decoders is currently not used for an external access to one of the memory cells of said memory cell array; and
    said contention circuit providing an address of a wordline of which the memory cells are to be refreshed to said row decoder of said first access port, if either a) the port select signal provided to said fist access port is activated and the port select signal provided to said second access port is deactivated or b) the port select signals provided to said first and second access ports are both activated, and wherein said contention circuit issues a wait signal to delay an externally requested access to a memory cell through said first access port during said refresh performed through said first access port.

4. The memory device according to claim 1, 2 or 3 wherein said contention circuit is designed to perform a wait cycle for an externally requested access for one of said ports, if the first and the second port select signals are activated.

5. The memory device according claim 4 wherein the memory cells each comprise a storage device having a first and a second terminal, a first access transistor connected to said first terminal and a second access transistor connected to said second terminal, said first access transistor connected to one of the multitude of said first wordlines and first bitlines, said second access transistor connected to one of the multitude of second wordlines and second bitlines.

6. The memory device according to claim 1, 2 or 3 wherein the memory cells each comprise a storage device having a first and a second terminal, a first access transistor connected to said first terminal and a second access transistor connected to said second terminal, said first access transistor connected to one of the multitude of said first wordlines and first bitlines, said second access transistor connected to one of the multitude of second wordlines and second bitlines.

7. A method of operating a memory device wherein said memory device has first and second access ports, memory cells being arranged in a multitude or rows, each row being accessible through said first and said second ports, and first and second row decoders, the method comprising:
  decoding one of said rows in response to a respective row address, wherein a refresh is performed on the memory cells of one of said rows by enabling said row through the first row decoder while another row is accessed in response to an externally requested access through the second row decoder; and
  counting the row address of rows to be refreshed and suppressing a refresh of the memory cells or a row when a row address of an externally requested access and the row address of said row to be refreshed match each other.

8. A memory array comprising:
  a plurality of memory cells arranged in a plurality of rows and columns, wherein a memory cell of the array comprises first and second wordlines in a row direction and first and second bitlines in a column direction;
  first and second ports capable of performing memory access and refresh operations, the first wordlines and bitlines corresponding to the first access port and the second wordlines and bitlines corresponding to the second access ports; and
  a refresh control circuit for controlling refresh operations, the refresh control circuit, when a refresh operation is requested, allocates the requested refresh operation to either the first or second port, whichever is not occupied with a memory access operation to reduce contention between the refresh operation and memory access operation.

9. The memory array of claim 8 wherein the refresh control circuit comprises normal and power down operating modes.

10. The memory array of claim 8 or 9 wherein the refresh control circuit allocates the refresh operation
  to either the first or second port if neither of the ports is occupied with a memory access operation;
  to the second port if the first port is occupied with a memory access operation;
  to the first port if the second port is occupied with a memory access operation; or
  when both first and second ports are occupied with respective memory access, delays the memory access to one of the first or second ports to enable refresh operation to the one of the first or second ports while allowing the memory access operation to continue at the other of the first or second port.

11. The memory array of claim 10 wherein the refresh control circuit rotates priority of access between the first and second ports when contention between refresh and memory access operations occurs.

12. The memory array of claim 8 or 9 wherein the refresh control circuit refreshes the memory cells one row at a time within a refresh cycle, wherein a row can be refreshed either via the first or second port.

13. The memory array of claim 12 wherein the refresh control circuit disables the refresh operation if the memory access is a read memory access and row addresses of the refresh and memory access operations are the same.

14. The memory array of claim 12 wherein the refresh control circuit disables the refresh operation if the memory access is a write memory access and row addresses of the refresh and memory access operations are the same, the memory cell of the row accessed is written to while other cells of the row accessed are read from.

15. The memory array of claim 12 wherein the refresh control circuit allocates the refresh operation of a row:
  to either the first or second port if neither of the ports is occupied with a memory access operation;
  to the second port if the first port is occupied with a memory access operation if a refresh row address is different from a row address of the memory access operation;
  to the first port if the second port is occupied with a memory access operation if the refresh row address is different from the memory row address; or
  when both first and second ports are occupied with respective memory accesses, delays the memory access to one of the first or second ports to enable refresh operation to the one of the first or second ports while allowing the memory access operation to continue at the other of the first or second port if the refresh row address is different from the row address.

16. The memory array of claim 15 wherein the refresh control circuit disables the refresh operation if the memory access is a read memory access and row addresses of the refresh and memory access operations are the same.

17. The memory array of claim 15 wherein the refresh control circuit disables the refresh operation if the memory access is a write memory access and row addresses of the refresh and memory access operations are the same, the memory cell of the row accessed is written to while other cells of the row accessed are read from.

18. The memory array of claim 15 wherein the refresh control circuit rotates priority of access between the first and second ports when contention between refresh and memory access operation occurs.

19. The memory array of claim 18 wherein the refresh control circuit disables the refresh operation if the memory access is a read memory access and row addresses of the refresh and memory access operations are the same.

20. The memory array of claim 18 wherein the refresh control circuit disables the refresh operation if the memory access is a write memory and row addresses of the refresh and memory access operations are the same, the memory cell of the row accessed is written to while other cells of the row accessed are read from.

* * * * *